United States Patent [19]

Chino et al.

[11] Patent Number: 4,976,992
[45] Date of Patent: Dec. 11, 1990

[54] COATING METHOD

[75] Inventors: Naoyoshi Chino; Yasuhito Hiraki; Tsunehiko Sato, all of Kanagawa, Japan

[73] Assignee: Fuji Photo Film Co., Ltd., Kanagawa, Japan

[21] Appl. No.: 417,160

[22] Filed: Oct. 4, 1989

[30] Foreign Application Priority Data

Oct. 14, 1988 [JP] Japan ................. 63-257281

[51] Int. Cl.$^5$ .................. B05D 5/08; B05D 5/12; B05D 1/32
[52] U.S. Cl. .................. 427/131; 427/284; 427/286
[58] Field of Search ............... 427/131, 284, 285, 286

[56] References Cited

U.S. PATENT DOCUMENTS 4,297,396 10/1981 Takehara et al. .................. 427/284

FOREIGN PATENT DOCUMENTS 61-257268 11/1986 Japan .

Primary Examiner—Evan Lawrence
Attorney, Agent, or Firm—Sughrue, Mion, Zinn, Macpeak & Seas

[57] ABSTRACT

A method for coating a running support with a coating solution, such as in the production of a magnetic recording medium, in which spreading of the coating solution into edge portions of the support not intended to be coated with the coating solution is prevented, hence providing a coating layer uniform in thickness and with good surface characteristics. Immediately before application of the coating solution to the support, a solvent is applied to regions of the support which are not to be coated with the coating solution and which are located on both sides of the coating region to be coated with the coating solution. In accordance with the invention, the solubility parameter of the solvent is made different from that of a solvent contained in the coating solution by at least 1.2 at a temperature of 25° C.

6 Claims, 1 Drawing Sheet

COATING METHOD

BACKGROUND OF THE INVENTION

The present invention relates to a method for coating a flexible belt-shaped support with coating solutions, and more particularly to an extrusion-type coating method used for manufacture of photographic photosensitive materials, magnetic recording media, or the like.

A variety of coating methods such as a roll-type coating method, a bead-type coating method, a slide-coat-type coating method and an extrusion-type coating method are available for applying coating solutions to a flexible belt-shaped support. The coating apparatuses used in practicing these methods are invariably smaller in width than the flexible belt-shaped support being coated. As a result, as shown in FIG. 2, the coated surface of the flexible belt-shaped support 1 has two regions A along its edges which are not coated with the coating solution 2.

Accordingly, in the case where, as in the case of an extrusion-type coating apparatus, the coating solution is applied to the flexible belt-shaped support running with the coating head abutted against it, the coating head may contact the two uncoated regions along the edges of the flexible belt-shaped support because the gap between the coating head and the flexible belt-shaped support is considerably small. As a result, the coating head may scrape the surfaces of the uncoated regions of the flexible belt-shaped support to form shavings, and the shavings thus formed may adhere to the ends of the coating edge of the coating head. Also, foreign matter on the support may be caught by the coating edge of the coating head.

Deposits of shavings and foreign matter at the two ends of the coating edge can push against the two edge portions of the flexible belt-shaped support, as a result of which the thickness of the coating solution applied to the support is not uniform in the widthwise direction of the latter; that is, the layer formed on the flexible belt-shaped support will have a greater thickness in the two edge regions than in the middle portion thereof.

In order to eliminate the above-described difficulty, a coating method has been proposed in Japanese Unexamined Published Patent Application No. 257268/1986 wherein immediately before applying the coating solution to a flexible belt-shaped support, a solvent is applied to the regions of the support which are not to be coated with the coating solution. With this method, both edge portions of the support are prevented from being directly brought into contact with the coating head, scraping of the support is prevented by the lubricating effect of the solvent applied thereto, and foreign matter on the support can be passed and will not be accumulated. Accordingly, the two edge portions of the support are prevented from being pushed upward, and accordingly the difficulty that the layer formed on the support is larger in thickness in the two edge portions is prevented.

However, the coating method proposed in Japanese Unexamined Published Patent Application No. 257268/1986 is still disadvantageous in that, as shown in FIG. 3, due to the presence of the solvent 7 in the regions outside the coating region of the flexible belt-shaped support, the coating solution 2 tends to spread in the widthwise direction of the support, flowing around the two ends of the edge portions of the coating head 3 and along a coating width regulating board 6.

If, during manufacture of a magnetic recording medium or the like, the coating solution 2 spreads to the two edge portions of the support 1 or to the rear side thereof, it will stick to the rolls conveying the support 1, and it may smudge a calendar roll employed in a following surface treatment process. As a result, the support surface can be scratched by foreign matter during the surface treatment, with the result that the magnetic recording characteristics of the medium are disturbed.

SUMMARY OF THE INVENTION

Accordingly, an object of the invention is to eliminate the above-described difficulties accompanying a conventional coating method. More specifically, an object of the invention is to provide a coating method which can form a layer uniform in thickness with good surface characteristic and which is free from the difficulty that the coating solution spreads to the edge portions of the support.

The present inventors have conducted intensive research on the reason why the coating solution spreads in the above-described manner, and found that because the solvents contained in the coating solution 2 and the solvent 7 are relatively close to each other in solubility parameter or solvent composition and are soluble in each other, they tend to mix in their interface, causing the coating solution 2 to spread towards the solvent 7.

The foregoing object of the invention has thus been achieved by the provision of a coating method in which, immediately before applying a coating solution to a flexible belt-shaped support, a solvent is applied to regions of the support which are not to be coated with the coating solution and are located outside the two edges of a coating region of the support, and in which, according to the invention, the difference in SP (solubility parameter) value between the solvent applied to the support and the solvent in the coating solution is at least 1.2 at a temperature of 25° C.

DESCRIPTION OF THE PREFERRED EMBODIMENTS

Figure 1:
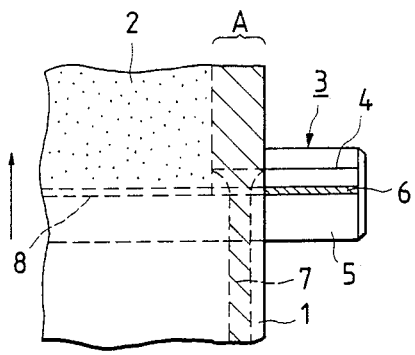
FIG. 1 is an enlarged view showing a part of a coating apparatus used to practice a coating method according to the invention.
Figure 2:
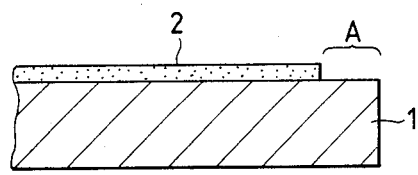
FIG. 2 is an enlarged sectional diagram used for a description of the conditions of a layer formed on a flexible belt-shaped support by coating.
Figure 3:
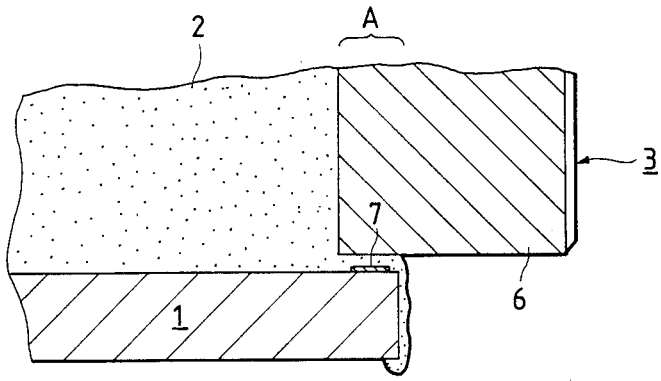
FIG. 3 is an enlarged sectional view of the coating section of the coating apparatus showing the spreading of a coating solution.

The SP value is the solubility parameter (SP value) $\delta$ of a solvent can be represented by the following equation:

$$\delta = \sqrt{(d/M)(\Delta H_v - RT)} \tag{1}$$

where $\Delta H_v$ is the latent heat of vaporization of the solvent, d is the density of the solvent, M is the molecular weight of the solvent, T is the absolute temperature of the solvent, and R is the molecular gas constant (1.986 cal/mol).

The value of $\Delta H_v$ can be calculated using the following equation:

$$\Delta H_v = 23.7 T_b + 0.02 T_b^2 - 2950 \quad \ldots (2)$$

where $T_b$ is the boiling point of the solvent.

According to the type of solvent used, the following correction value is added to the result of calculation:

| | |
|---|---|
| Hydrocarbon solvent | No correction |
| Ketone solvent (boiling point 100° or higher) | No correction |
| Ketone solvent (boiling point lower than 100°) | +0.5 |
| Ester solvent | +0.6 |
| Alcohol solvent | +1.4 |

In the case of a mixture of solvents, the sum of the SP values determined according to the volume percentage of the solvents is employed, and in this case additives other than the solvents (such as a surface active agent for water) are not taken into account.

In the case where the solvent in the coating solution is a mixture of solvents, it is preferable that the sum of the SP values determined according to the volume percentages of those solvents be employed as the SP value.

The invention will now be described with reference to a specific example thereof.

EXAMPLE OF THE INVENTION

Various components combined as indicated in the following Table 1 were sufficiently mixed and dispersed in a ball mill, and epoxy resin (epoxy equivalent weight 500) 30 parts by weight was added, uniformly mixed and dispersed to form a magnetic coating solution. The magnetic coating solution thus formed was applied to a polyethylene terephthalate support 15 μm thick and 520 mm wide under the following coating conditions:

coating rate: 20 cc/m²
coating speed: 200 m/min
coating tension: 10 kg/520 mm (width)
coating width: 500 mm Accordingly, uncoated regions 10 mm in width were formed outside the coating region of the support along both edges of the support.

A coating apparatus having an extrusion-type coating head as shown in FIG. 1 was used.

The extrusion-type coating head 3 of the coating apparatus was wider than the width of the flexible belt-shaped support 1, and had a slot 8 for jetting a coating solution over the width of the support. Regulating boards 6 were fitted in both end portions, in the widthwise direction, of the slot 8 so as to define the coating width, that is, to provide two uncoated regions along the edges of the flexible belt-shaped support 1. The uncoated regions were each A in width.

The coating solution was applied to the flexible belt-shaped support 1 using the coating apparatus. Immediately before the formation of the layer 2, a solvent 7 was applied to the regions not to be coated with the coating solution and located outside the coating region to be coated with the coating solution. The application of the solvent 7 was controlled so that the solvent spread substantially over the entire uncoated region, or it spread only slightly over the coating region (corresponding to the layer 2 of coating solution), and the thickness was in compliance with the thickness of the layer 2 of coating solution.

The coating rate may be in a range of 0.01 to 10 cc/m², preferably in a range of 0.05 to 5 cc/m² with the solvent spread with a doctor edge 4.

A conventional coating method may be employed, that is, a method of using an air doctor, blade coater, load coater, knife coater, slide coater, roll coater, gravure coater, kiss coater, spray coater, or slot orifice coater, or a method of pushing wet cloth or the like against the support, or a method of jetting a solution through an extremely small diameter tube such as an injection needle may be employed.

After solvents listed in the following Table 2 were applied to the uncoated regions of the supports 1, the above-described coating solution was employed to manufacture magnetic recording media. The magnetic recording media thus manufactured were checked to determine whether or not the coating solution had spread out. The results of this inspection are as indicated in Table 2.

TABLE 1

| Composition | |
|---|---|
| $\gamma$-Fe$_2$O$_3$ (Hc 700 Oe) | 100 parts by weight |
| copolymer (vinyl chloride/vinyl acetate) | 10 parts by weight |
| Carbon black (average particle size 20 μm) | 12 parts by weight |
| Polyurethane resin "Nipporan-2301" (manufactured by Nippon Polyurethane Co., Ltd.) | 8 parts by weight |
| Stearic acid | 1 part by weight |
| Butyl Stearate | 1 part by weight |
| Polyisocyanate "Coronate L" (manufactured by Nippon Polyurethane Co., Ltd.) | 8 parts by weight |
| Solvent | |
| Methyl ethyl ketone | 120 parts by weight |
| Butyl acetate | 170 parts by weight |
| Toluene | 10 parts by weight |

TABLE 2

| Solvent | SP value (25° C.) | Coating Solution Spreading |
|---|---|---|
| Isooctane | 6.9 | O |
| O-xylene | 9.0 | X |
| Cyclohexanone | 9.9 | Δ |
| Acetone | 10.0 | O |
| Methyle cellosolve | 10.8 | O |
| Methanol | 14.5 | O |
| Trifluoro acetate | 12.5 | O |
| n-heptane | 7.4 | O |
| n-octane | 7.6 | O |
| Ethyl acetate | 8.0 | X |
| Toluene | 8.9 | X |
| Water | 23.4 | O |
| Magnetic dispersion liquid mixed solvent | 8.9 | |

Legend
O: formed stable layer, no spreading.
Δ: formed layer unstable, but no spreading.
X: formed layer unstable, greatly spread.

As is apparent from Table 2, in the case where a solvent was used which had an SP value different by 1.2 or more from that of the mixed solvent in the coating, the formed layer was satisfactory, being free from the difficulty of the coating solution undesirably spreading. In the case where the solvent had an SP value different by less than 1.2, the formed layer was unstable, with the coating solution spreading considerably.

The above example of the invention has been described with reference to a method of forming a magnetic layer to manufacture magnetic recording media. However, it should be noted that the invention is not limited thereto or thereby. For instance, the technical concept of the invention is applicable to a coating method for forming a photosensitive layer on a flexible belt-shaped support to form photographic photosensitive materials.

As described above, in the coating method of the invention, immediately before a coating solution is applied to a flexible belt-shaped support, a solvent whose SP value is different by at least 1.2 at a temperature of 25° C. from that of the solvent contained in the coating solution is applied to the regions of the support which are not to be coated with the coating solution and located outside the coating region of the support. As a result, the solvents are scarcely mixed at the interface of the coating solution and the solvent, which prevents the coating solution from spreading towards the solvent.

Thus, with the coating method according to the invention, the layer formed on the support is uniform in thickness and has excellent surface characteristics, and very little spreading of the coating solution occurs.

What is claimed is:

1. In a coating method in which, immediately before application of a coating solution to a running flexible belt-shaped support, a first solvent is applied to regions of said support which are not to be coated with said coating solution and are located on both sides of a coating region of said support which is to be coated with said coating solution, the improvement wherein the solubility parameter of said first solvent is different from that of a second solvent contained in said coating solution by at least 1.2 at a temperature of 25° C.

2. The method of claim 1, wherein a coating rate of said first solvent is in a range of 0.01 to 10 cc/m$^2$.

3. The method of claim 1, wherein a coating rate of said first solvent is in a range of 0.05 to 5 cc/m$^2$.

4. The method of claim 1, wherein said first solvent is spread with a doctor blade.

5. The method of claim 1, wherein said coating solution is a magnetic coating solution.

6. The method of claim 1, wherein said coating solution is a photographic photosensitive coating solution.

* * * * *